United States Patent [19]
Unkrich et al.

[11] Patent Number: 5,969,570
[45] Date of Patent: Oct. 19, 1999

[54] REDUCED-TAP FILTER IN A DEMODULATOR

[75] Inventors: Mark Unkrich, Redwood City; William J. Hillery, Santa Clara; V. Rao Sattiraju, Union City, all of Calif.

[73] Assignee: Hewlett-Packard Company, Palo Alto, Calif.

[21] Appl. No.: 09/040,524

[22] Filed: Mar. 16, 1998

[51] Int. Cl.⁶ .................................................. H04L 27/38
[52] U.S. Cl. ..................... 329/304; 329/307; 375/326; 375/327; 375/343
[58] Field of Search .................................... 329/304, 306, 329/307, 308, 309, 310; 375/324, 326, 327, 328, 343

[56] References Cited

U.S. PATENT DOCUMENTS 5,311,545  5/1994  Critchlow ............................ 329/304
5,610,948  3/1997  Ninomiya et al. ................... 329/304
5,692,013  11/1997  Koslov et al. ....................... 329/304

*Primary Examiner*—Siegfried H. Grimm

[57] ABSTRACT

A demodulator with a filter having a reduced number of filter taps without a sacrifice in filter accuracy. The demodulator includes elements that generate a data stream that carries a component of an input signal in response to a data stream that carries samples of the input signal. The demodulator also includes elements that generate a sample clock for sampling the input signal such that the sample clock is preselected to cause the data stream that carries the component to carry alternating samples that are substantially equal to zero. The filter in the demodulator has a set of filter taps which are arranged to tap only the samples in the data stream that carries the component that are not substantially equal to zero.

17 Claims, 4 Drawing Sheets

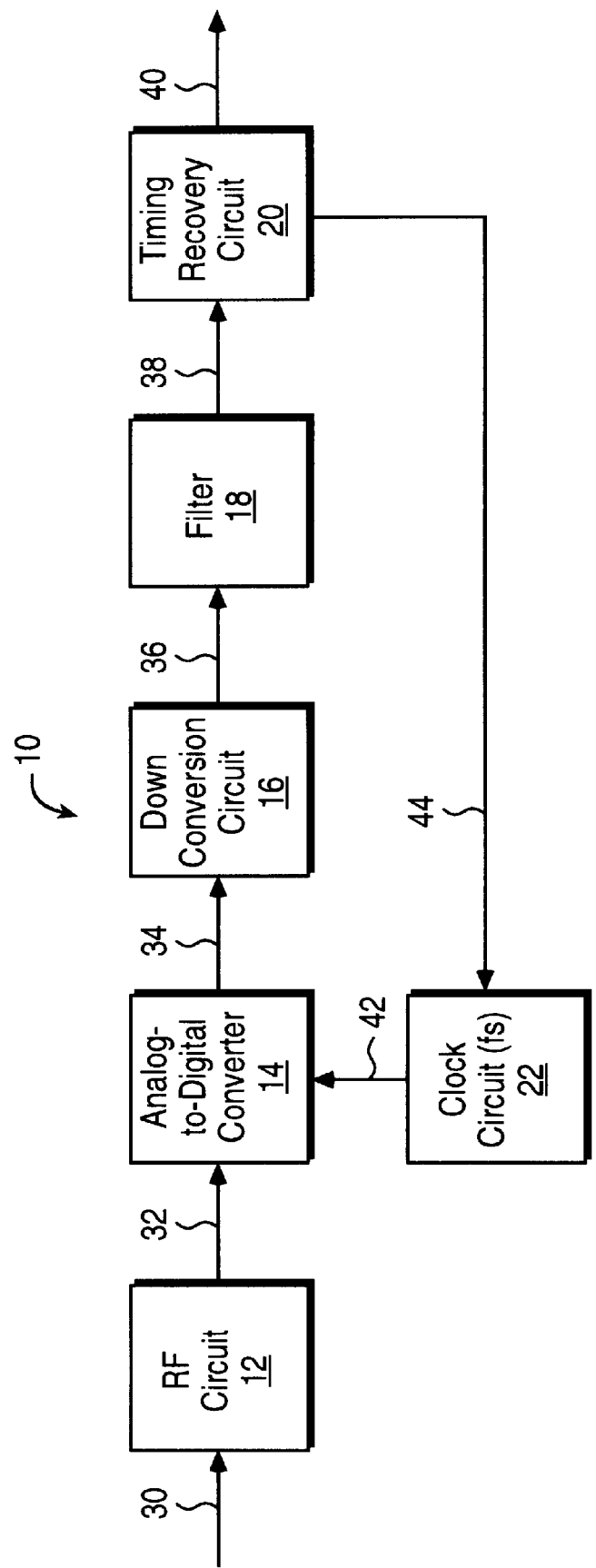

5,969,570

REDUCED-TAP FILTER IN A DEMODULATOR

BACKGROUND OF THE INVENTION

1. Field of Invention

The present invention pertains to the field of communication systems. More particularly, this invention relates to a reduced-tap filter in a demodulator.

2. Art Background

Communication systems commonly employ signal modulation to generate an information signal which is suitable for transmission via a communication channel. Such a communication system usually includes a transmitting station having a modulator that generates the information signal and a receiving station having a demodulator that extracts the information carried by the information signal. The information in an information signal is usually carried as a sequence of symbols each of which is defined by an amplitude component and a frequency component.

In addition, prior demodulators typically include one or more filters. For example, prior demodulators usually include one or more matched filters which are provided to filter the amplitude and frequency components so as to reduce interference among successive symbols in the information signal. Interference between successive symbols is commonly referred to as inter-symbol interference.

Prior filters are commonly implemented with a series of delay circuits that provide a series of filter taps and a multiplier and an adder for each filter tap. Typically, the multipliers are used to multiply the signal provided by each filter tap by a corresponding filter coefficient and the adders are used to accumulate the results and provide an output signal for the filter.

The accuracy of a prior filter usually increases as the number of filter taps increases. However, as the number of filter taps increases so does the number of multipliers and adders. Unfortunately, an increase in the number of multipliers and adders increases the integrated circuit die space required to implement a filter and increases the overall cost of a communication system.

SUMMARY OF THE INVENTION

A demodulator is disclosed with a filter having a reduced number of filter taps without a sacrifice in filter accuracy. The demodulator includes elements that generate a data stream that carries a component of the input signal in response to a data stream that carries samples of an input signal. The demodulator also includes elements that generate a sample clock for sampling the input signal such that the sample clock is preselected to cause the data stream that carries the component to carry alternating samples that are substantially equal to zero. The filter in the demodulator has a set of filter taps which are arranged to tap only the samples in the data stream that carry the component that are not substantially equal to zero. The alternating patterns of zero samples enable the elimination of filter taps for these zero samples, thereby eliminating multipliers and adders associated with the eliminated filter taps. In addition, the reduction in the number of filter taps enables a reduction in clock frequency which reduces the power consumption of the filter.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 1 illustrates a demodulator which includes a filter having a reduced number of taps according to the present techniques;

DETAILED DESCRIPTION

Figure 2A:
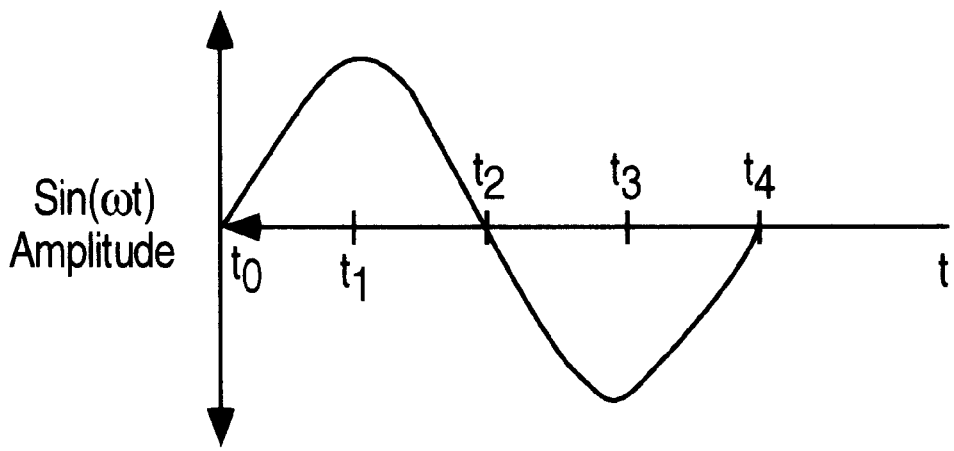
FIGS. 2a–2b illustrate sine and cosine terms of the output of a down conversion circuit in relation to the optimal sampling point of the input signal.

FIG. 1 illustrates a demodulator 10 which includes a filter 18 having a reduced number of taps according to the present techniques. The demodulator 10 includes an RF circuit 12 which receives an information signal 30 via a communication channel. The RF circuit 12 amplifies the information signal 30 and provides an input signal 32 to an analog-to-digital converter 14.

The analog-to-digital converter 14 generates a digital signal 34 ($a_k$) by sampling the input signal 32 in response to a sample clock 42 generated by a clock circuit 22. The sample clock 42 has a preselected frequency ($f_s$) that enables a reduction in the number of filter taps in the filter 18. In one embodiment, the preselected frequency $f_s$ is substantially equal to four times the carrier frequency ($f_c$) of the information signal 30, i.e. $f_s = 4f_c$.

The clock circuit 22 and a timing recovery circuit 20 provide a phase locked loop that is used to finely adjust the frequency and the phase of the sample clock 42 to an optimum sample point of the input signal 32. The timing recovery circuit 20 generates an error signal 44 that indicates errors in the phase of the sample clock 42. The clock circuit 22 includes a voltage controlled oscillator and a filter circuit. The filter circuit in the clock circuit 22 filters the error signal 44 and provides a D.C. signal to the voltage controlled oscillator in the clock circuit 22. This D.C. voltage is the D.C. component of the error signal 44 and causes the voltage controlled oscillator to adjust the phase of the sample clock 42 to maintain an optimal sample point by which the analog-to-digital converter 14 samples the input signal 32.

The down conversion circuit 16 generates a complex signal 36 ($b_k$) in response to the digital signal 34 ($a_k$). The down conversion circuit 16 translates the digital signal 34 down to the original baseband frequency of the information signal generated at a transmitting station and separates out the in-phase and quadrature components. The complex signal 36 provides the in-phase component in its real part and the quadrature component in its imaginary part. The down conversion circuit 16 generates the complex signal 36 according to the following (equation 1):

$$b_k = a_k e^{j\omega t}$$

where k is an index to the time samples carried by the digital signal 34.

Equation 1 may be expanded as follows:

$$b_k = a_k \cos \omega t + j a_k \sin \omega t$$

where the cosine term is the in-phase component, the sine term is the quadrature component, and $\omega = 2\Pi f_c$.

In one embodiment, the filter 18 is a matched filter that generates a complex signal 38 ($C_k$) by performing a root-raised-cosine (RRC) filtering function on the complex signal 36 ($b_k$). The filter 18 includes a pair of filters one of which filters a data stream that carries the real component of $b_k$ to generate the real component of $c_k$ and one of which filters a data stream that carries the imaginary component of $b_k$ to generate a data stream that carries the imaginary component of $c_k$.

The transfer function for an RRC filter in one embodiment may be represented as follows (equation 2):

$$y_k = \sum_{i=0}^{N} w_i x_{k-i}$$

where $W_i$ are filter coefficients, N+1 is the number of filter coefficients, and $x_k$ is the filter input which is either the real or the imaginary component of $b_k$.

Equation 2 may be expanded as follows:

$$y_k = w_0 x_k + w_1 x_{k-1} + w_2 x_{k-2} \ldots + w_N x_{k-N}$$

Thus, the real component of $c_k$ ($Re[c_k]$) is given by (equation 3)

$$Re[c_k] = w_0 Re[b_k] + w_1 Re[b_{k-1}] + w_2 Re[b_{k-2}] \ldots + w_N Re[b_{k-N}]$$

and the imaginary component of $c_k$ ($Im[c_k]$) is given by (equation 4)

$$Im[c_k] = w_0 Im[b_k] + w_1 Im[b_{k-1}] + w_2 Im[b_{k-2}] \ldots + w_N Im[b_{k-N}]$$

Figure 2B:
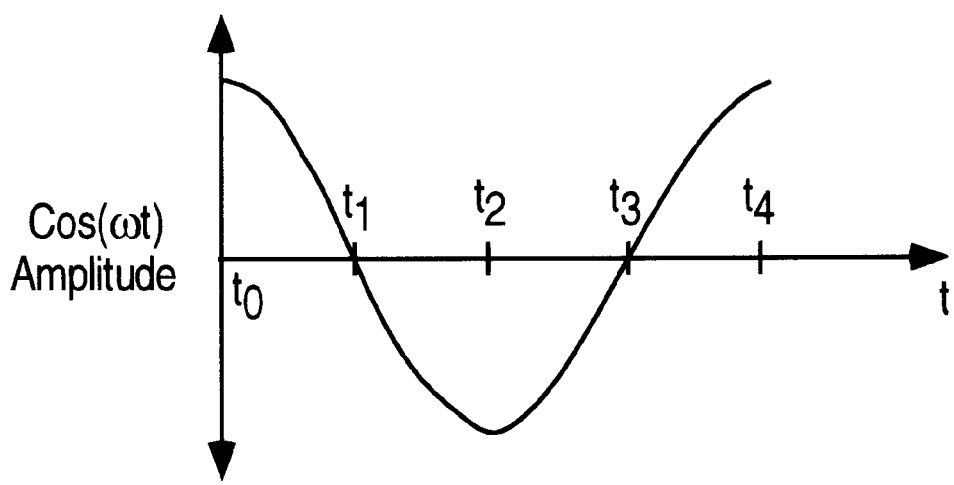

FIGS. 2a–2b illustrate the sine and cosine terms of equation 1 in relation to the optimal sampling point. The optimal sampling point which is maintained by the phase locked loop elements described above corresponds to the zero crossing of the sine term at time $t_0$. Samples are also taken at times $t_1$, $t_2$, $t_3$, and $t_4$ since $f_s = 4f_c$. At time $t_0$, the sine term is zero, while at time $t_1$, the cosine term is zero. This alternating pattern of zeros in the sine and cosine terms continues at times $t_3$ and $t_4$ and beyond.

Therefore, the $f_s = 4f_c$ relationship combined with the optimal sample point provided by controlling the phase of the sample clock 42 causes the cosine term of equation 1 to be zero whenever the sine term is plus or minus one and causes the sine term to be zero whenever the cosine term is plus or minus one. As a consequence of this it can be seen that the real component of $b_k$ ($Re[b_k]$) is given by (equation 5)

$$Re[b_k] = \begin{vmatrix} \pm a_k; & (k-even) \\ 0; & (k-odd) \end{vmatrix}$$

and that the imaginary component of $b_k$ ($Im[b_k]$) is given by (equation 6)

$$Im[b_k] = \begin{vmatrix} \pm ja_k; & (k-odd) \\ 0; & (k-even) \end{vmatrix}$$

When this information is applied to equation 3 it can be seen that every other term used to calculate $Re[c_k]$ is zero. Thus, equation 3 may be reduced to (equation 7) for k even $$Re[c_k] = w_0 Re[b_k] + w_2 Re[b_{k-2}] + w_4 Re[b_{k-4}] \ldots$$

Similarly, every other term in equation 4 used to calculate $Im[c_k]$ is zero. Thus, equation 4 may be reduced to (equation 8) for k even $$Im[c_k] = w_1 Im[b_{k-1}] + w_3 Im[b_{k-3}] + w_5 Im[b_{k-5}] \ldots$$

The complex signal 38 includes a data stream that carries the real component of $c_k$ and a data stream that carries the imaginary component of $c_k$. The timing recovery circuit 20 ignores every other sample in the data stream that carries the real component of $c_k$ and ignores every other value in the data stream that carries the imaginary component of $c_k$. The ignored samples of the $c_k$ data streams are the samples for k odd.

The information provided by equations 7 and 8 (when k is even) combined with the fact that the timing recovery circuitry 20 ignores every other sample in the $c_k$ data streams is useful for eliminating multipliers and adders in the filter 18 and thereby conserving integrated circuit die space and achieving cost savings for the demodulator 10. For example, multipliers and adders that would otherwise be needed for calculations involving $w_1$, $w_3$, $w_5$, etc. may be eliminated from the portion of the filter 18 that generates $Re[c_k]$. In addition, multipliers and adders that would otherwise be needed for calculations involving $w_0$, $w_2$, $w_4$, etc. may be eliminated from the portion of the filter 18 that generates $Im[c_k]$.

Figure 3:
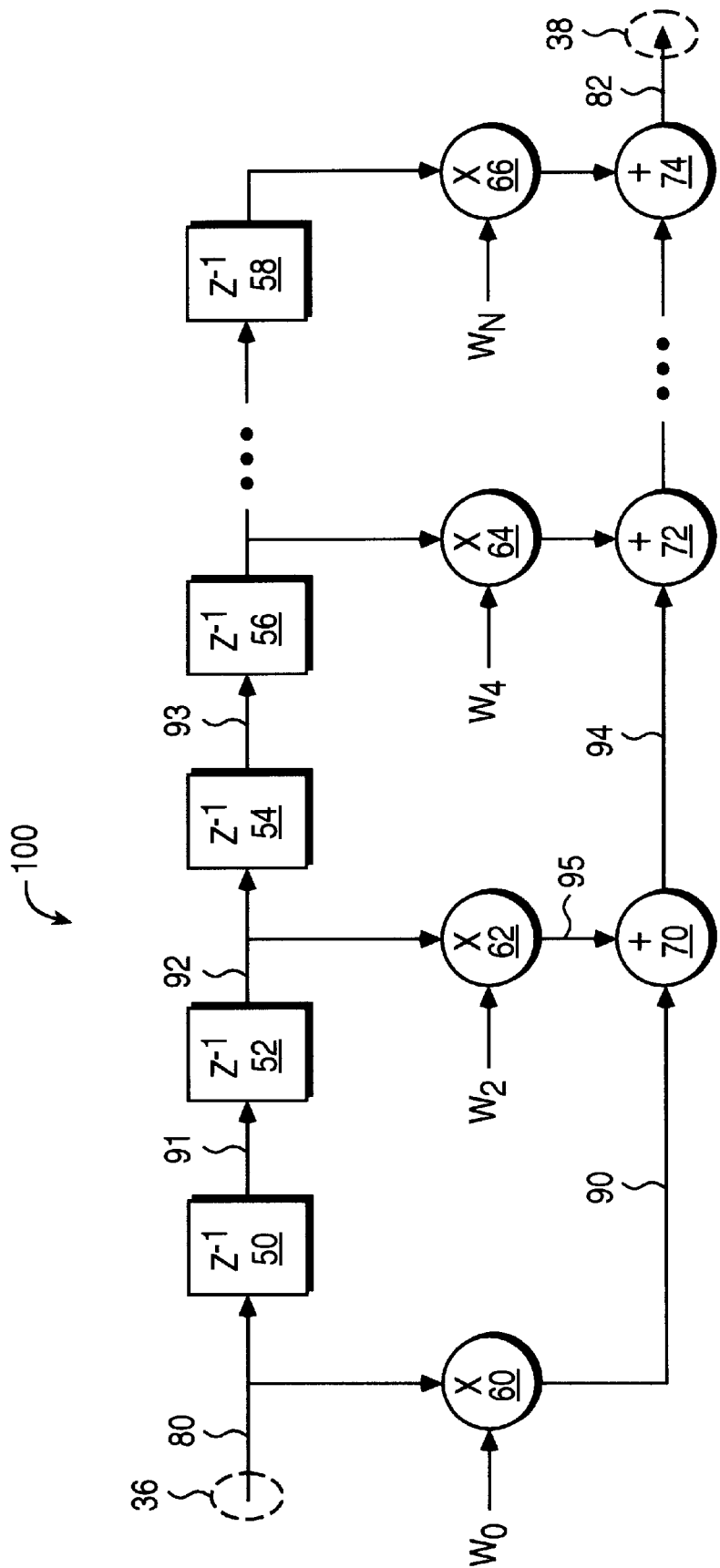
FIG. 3 illustrates one embodiment of a filter that processes a data stream from the down conversion circuit.

FIG. 3 illustrates a filter 100 that generates the data stream that carries $Re[c_k]$ in one embodiment of the filter 18. The filter 100 includes a set of delay elements 50–58 each of which may be implemented as a bank of flip flops. The filter also includes a set of multipliers 60–66 and a set of adders 70–74.

A signal line 80 provides a data stream that carries $Re[b_k]$ which is input to the delay element 50 and the multiplier 60. The multiplier 60 generates the $w_0 Re[b_k]$ signal, per equation 7, on a signal line 90. The delay element 50 generates the $Re[b_{k-1}]$ signal on a signal line 91. The $Re[b_{k-1}]$ signal is ignored because it does not contribute to equation 7. The $Re[b_{k-1}]$ signal does not contribute because it is zero according to equation 5 (when k is even). This eliminates a multiplier and an adder in the filter 100 that would otherwise be coupled to the signal line 91 and be used to generate a $w_1 Re[b_{k-1}]$ signal had equation 5 not been true.

The delay element 52 generates the $Re[b_{k-2}]$ signal on a signal line 92 and a multiplier 62 generates the $w_2 Re[b_{k-2}]$ signal per equation 7 on a signal line 95. The delay element 54 generates the $Re[b_{k-3}]$ signal on a signal line 93 which is ignored because it does not contribute to equation 7 (when k is even). This also eliminates a multiplier and an adder that would otherwise be used to generate the signal $w_3 Re[b_{k-3}]$.

As shown, the multipliers and adders that would otherwise be used to generate the terms of equation 7 involving $w_1$, $w_3$, $w_5$, etc. are eliminated thereby achieving significant hardware savings in the demodulator 10. The multiplier 66 and the adder 74 are only present when N is even. A signal line 82 from the last adder 74 in the filter 100 provides the $Re[c_k]$ data stream.

A filter in the filter 18 for generating a data stream that carries $Im[c_k]$ includes a similar arrangement to that of the filter 100 but with the following differences. The multipliers and adders that would be used to generate the terms involving $w_0$, $w_2$, $W_4$, etc. are eliminated from the filter for generating $Im[c_k]$ in accordance with equation 8.

Figure 4:
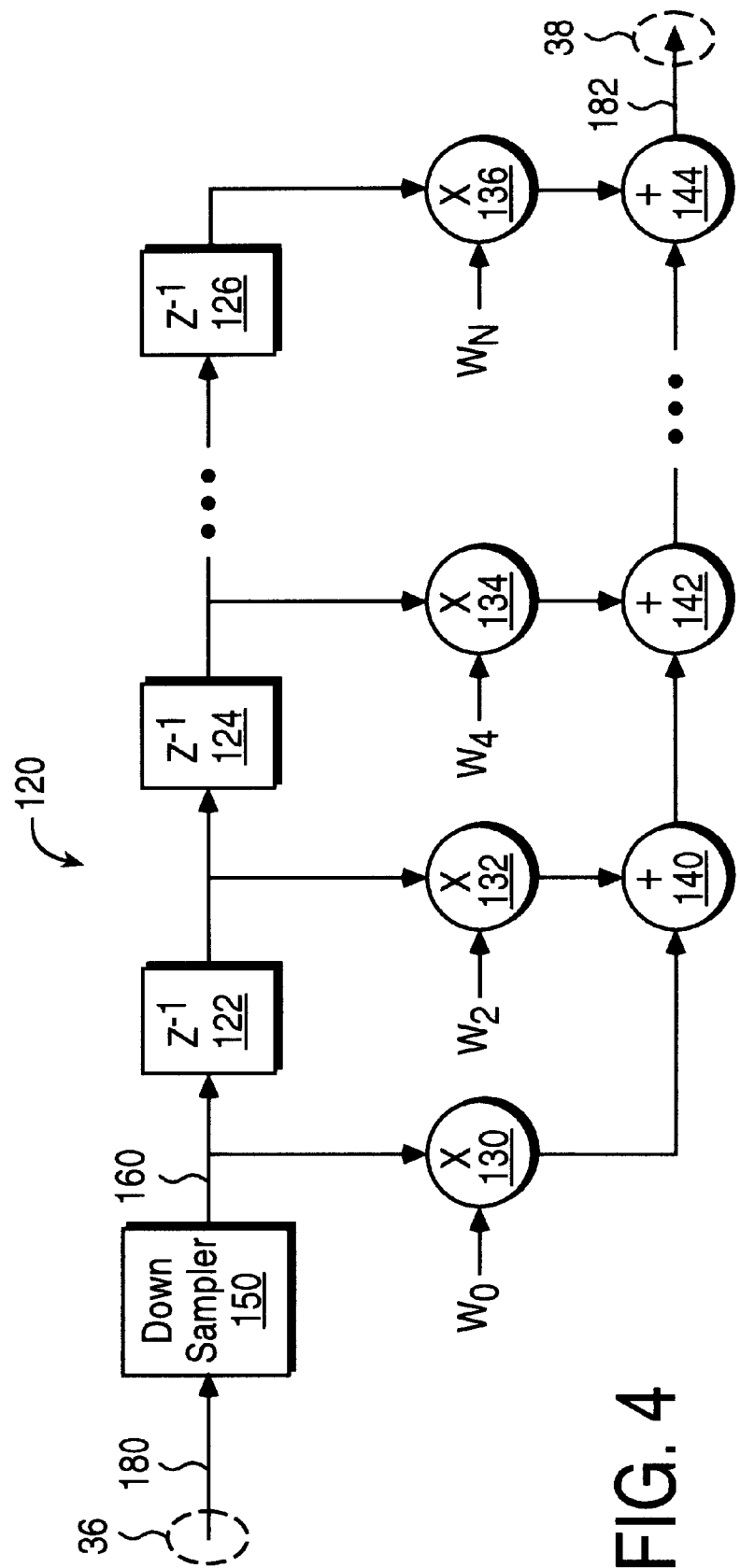
FIG. 4 illustrates another embodiment of a filter that processes a data stream from the down conversion circuit.

FIG. 4 illustrates a filter 120 that generates a data stream that carries $Re[c_k]$ in another embodiment of the filter 18. The filter 120 includes a set of delay elements 122–126, a set of multipliers 130–136, a set of adders 140–144, and a down sampler 150.

The down sampler 150 receives the $Re[b_k]$ data stream via a signal line 180. The $Re[b_k]$ data stream provides samples at a rate of $4f_c$. The down sampler 150 generates a data stream on a signal line 160 by down sampling the $Re[b_k]$ data stream to a rate of $2f_c$. The down sampler 150 down samples from $4f_c$ to $2f_c$ by skipping every other sample in the Re[$b_k$] data stream and providing only the samples of the Re[$b_k$] data stream for which k is even to the delay element 122.

As a consequence of the down sampling, the data stream on the signal line 160 provides Re[$b_0$], Re[$b_2$], Re[$b_4$], etc., without the intervening Re[$b_1$], Re[$b_3$], Re[$b_5$], etc. samples which do not contribute to the determination of Re[$c_k$] according to equation 7, i.e. they are equal to zero. This means that the delay elements that would be needed to hold the Re[$b_1$], Re[$b_3$], Re[$b_5$], etc. samples can be eliminated from the filter 120 which yields even more hardware savings. A signal line 182 from the last adder 144 provides the Re[$c_k$] data stream.

The down sampler 150 may be implemented with a data latch that is clocked by a clock signal having a frequency of $2f_c$ and having rising edges aligned to rising edges of the clock signal 42.

A filter in the filter 18 for generating the term Im[$c_k$] includes a similar arrangement to that of the filter 120 but with the following differences. The down sampler for Im[$c_k$] down samples from $4f_c$ to $2f_c$ by skipping every other sample in the Im[$b_k$] data stream and providing only the samples of Im[$b_k$] data stream for which k is odd to the delay elements.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A demodulator, comprising:
   means for generating at least one data stream that carries a component of an input signal in response to a data stream that carries samples of an input signal;
   means for generating a sample clock for sampling the input signal and providing the data stream that carries samples of the input signal such that the sample clock is preselected to cause the data stream that carries the component to carry alternating samples that are substantially equal to zero;
   filter having a set of filter taps which are arranged to tap only the samples in the data stream that carries the component that are not substantially equal to zero.

2. The demodulator of claim 1, wherein the means for generating a sample clock generates the sample clock at a preselected frequency substantially equal to four times a carrier frequency of the input signal.

3. The demodulator of claim 1, wherein the means for generating a sample clock adjusts a phase of the sample clock to an optimal sample point of the input signal.

4. The demodulator of claim 1, wherein the filter comprises a series of delay elements and a series of multipliers corresponding to the filter taps such that a pair of the delay elements are positioned in between each successive pair of filter taps.

5. The demodulator of claim 1, wherein the filter comprises:
   down sampler that eliminates the alternating samples that are substantially equal to zero from the data stream that carries the component;
   a series of delay elements and a series of multipliers corresponding to the filter taps such that one of the delay elements is positioned in between each successive pair of filter taps.

6. The demodulator of claim 1, wherein the filter generates an output data stream by performing a root-raised-cosine function on the data stream.

7. The demodulator of claim 1, wherein the filter comprises:
   first filter coupled to receive a data stream that carries an in-phase component and having a set of filter taps which are arranged to tap only the samples in the data stream that carries the in-phase component that are not substantially equal to zero;
   second filter coupled to receive a data stream that carries a quadrature component and having a set of filter taps which are arranged to tap only the samples in the data stream that carries the quadrature component that are not substantially equal to zero.

8. A demodulator, comprising:
   analog-to-digital converter that generates an input signal in response to a sample clock;
   down conversion circuit that generates at least one data stream that carries a component of the input signal in response to the input signal;
   phase locked loop circuit that adjusts a frequency and a phase of the sample clock such that the data stream that carries the component carries alternating samples that are substantially equal to zero;
   filter having a set of filter taps which are arranged to tap only the samples in the data stream that carry the component that are not substantially equal to zero.

9. The demodulator of claim 8, wherein the frequency is preselected to be substantially equal to four times a carrier frequency of the input signal.

10. The demodulator of claim 8, wherein the phase is adjusted to an optimal sampling point for the input signal.

11. The demodulator of claim 8, wherein the filter comprises a series of delay elements and a series of multipliers corresponding to the filter taps such that a pair of the delay elements are positioned in between each successive pair of filter taps.

12. The demodulator of claim 8, wherein the filter comprises:
   down sampler that eliminates the alternating samples that are substantially equal to zero from the data stream that carries the component;
   a series of delay elements and a series of multipliers corresponding to the filter taps such that one of the delay elements is positioned in between each successive pair of filter taps.

13. The demodulator of claim 8, wherein the filter generates an output data stream by performing a root-raised-cosine function on the data stream.

14. The demodulator of claim 8, wherein the filter comprises:
   first filter coupled to receive a data stream that carries an in-phase component and having a set of filter taps which are arranged to tap only the samples in the data stream that carries the in-phase component that are not substantially equal to zero;
   second filter coupled to receive a data stream that carries a quadrature component and having a set of filter taps which are arranged to tap only the samples in the data stream that carries the quadrature component that are not substantially equal to zero.

15. A method for reducing a number of filter taps in a filter of a demodulator, comprising the steps of:
   generating at least one data stream that carries a component of an input signal in response to a data stream that carries samples of the input signal;
   generating a sample clock for sampling the input signal and providing the data stream that carries samples of the input signal;

adjusting the sample clock such that the sample clock causes the data stream that carries the component to carry alternating samples that are substantially equal to zero which enables the filter taps to be arranged to tap only the samples in the data stream that carries the component that are not substantially equal to zero.

16. The method of claim 15, wherein the step of adjusting the sample clock includes the step of adjusting the sample clock to a preselected frequency substantially equal to four times a carrier frequency of the input signal.

17. The method of claim 15, wherein the step of adjusting the sample clock includes the step of adjusting a phase of the sample clock to an optimal sample point of the input signal.

* * * * *